United States Patent [19]

Devine et al.

[11] 4,233,667
[45] Nov. 11, 1980

[54] DEMAND POWERED PROGRAMMABLE LOGIC ARRAY

[75] Inventors: William T. Devine, Ulster Park; William Gianopulos, West Hurley, both of N.Y.

[73] Assignee: International Business Machines Corporation, Armonk, N.Y.

[21] Appl. No.: 954,136

[22] Filed: Oct. 23, 1978

[51] Int. Cl.$^3$ .................. G06F 1/00; H03K 19/20
[52] U.S. Cl. .................. 364/900; 307/207; 340/166 R; 364/707; 364/716
[58] Field of Search ........ 364/900, 707, 900 MS File, 364/716; 307/207; 365/227; 340/166 R, 147 R, 147 P

[56] References Cited

U.S. PATENT DOCUMENTS

| | | | |
|---|---|---|---|
| 4,037,089 | 7/1977 | Horninger | 364/900 X |
| 4,140,921 | 2/1979 | Balasbramanian et al. | 307/207 X |
| 4,151,611 | 4/1979 | Sugawara et al. | 364/900 X |

*Primary Examiner*—Raulfe B. Zache
*Attorney, Agent, or Firm*—James E. Murray

[57] ABSTRACT

This specification describes a programmable logic array (PLA) for performing logic functions on binary variables in a plurality of sequentially functioning arrays in which at least one of the arrays is conditionally powered when and only when the binary variables are supplied to the PLA in a logically useful combination.

6 Claims, 4 Drawing Figures

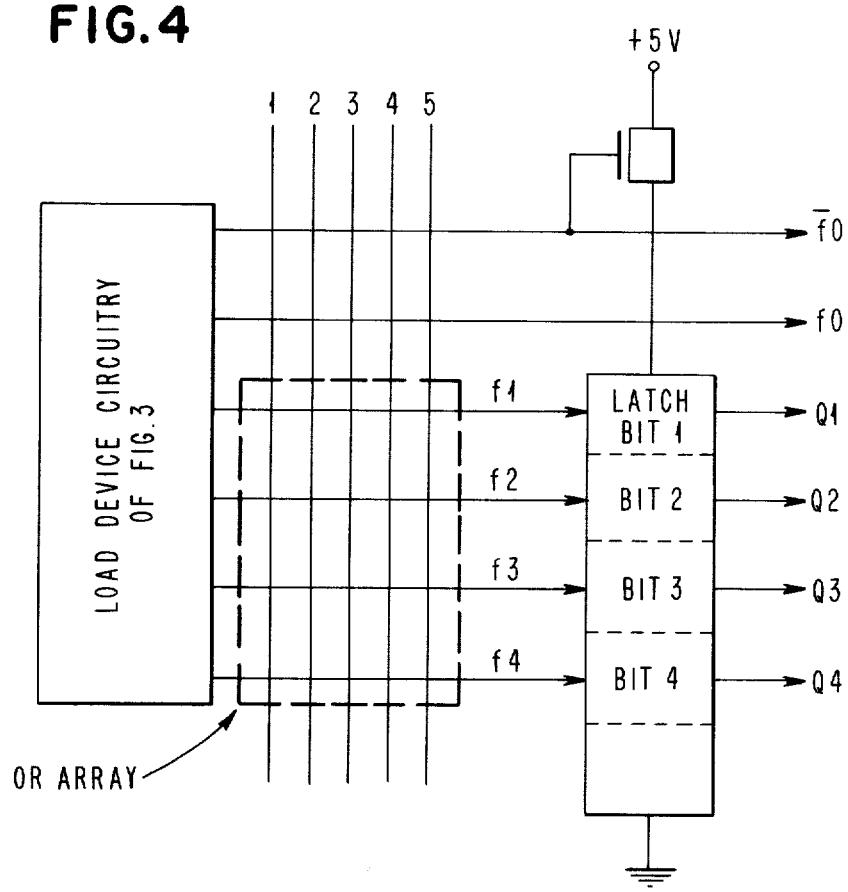

DEMAND POWERED PROGRAMMABLE LOGIC ARRAY

BACKGROUND OF THE INVENTION

The present invention relates to arrays for performing logic functions such as a programmable logic array (PLA). More particularly, it relates to the powering of such arrays for performing logic functions.

The performing of logic in matrices of identical circuit elements each located at a unique intersection of input and output lines is well known. One well known arrangement for doing this is referred to as a programmable logic array or PLA. In Cox et al U.S. Pat. No. 3,987,287, assigned to the present assignee, a PLA is described in which an input signal is fed to decoders which generate min-terms and feed them to a first array called a product term generator or an AND array. The outputs of this AND array or the product terms are fed to a second array called the sum of product term generator or OR array. The outputs of the OR array are then fed to latches so that they can be used at a later time as inputs to the same PLA in performing a second logic function.

In the past the powering of the arrays has been done in a number of ways. One such scheme for powering is to statically power the AND array and OR array. That is, once the PLA is powered up the AND arrays or OR arrays are powered continuously with excitation voltage whether they are performing a logical function or not. Of course this consumes significant amounts of power so that schemes for the dynamic powering of the arrays have been used. In such dynamic powering schemes, either or both of the arrays are usually maintained in an off power state until they are ready to use. Then a clock signal is fed to the array and activates switches that allow power to reach the arrays in the PLA. Dynamic powering of both the AND and OR arrays would appear to offer the lowest power consumption. However, even with dynamic powering schemes the arrays may not perform useful logic functions each time they are powered up. Furthermore, with such schemes the benefits of dynamic powering are partially offset by the additional circuitry required for the generating of the multiple overlapping clock signals needed for such powering. In addition, when it is desired to place two or more PLAs on the same chip having different timing and performance requirements the complex circuitry needed on the generation of the clock signals makes it impractical to implement dynamically powered AND and OR arrays in all the PLAs on the chip. Therefore as a compromise, the AND arrays have been dynamically powered while the OR arrays are statically powered; thereby obtaining partial benefits of dynamic powering while avoiding the complexities of dynamically powering both AND and OR arrays.

In Henle U.S. Pat. No. 3,599,182, assigned to the same assignee as the present application, it is suggested that decoders for a memory cell be dynamically powered. Here the decoder is split into halves and the first half of the decoder is powered all of the time while only a portion of the second half of the decoder is energized after the first half of the decoder is assessed and it is apparent that that portion of the second half will be used. Thus the Henle patent describes the technique of using the inputs of the signals to energize the decoders associated with memory arrays.

THE INVENTION

In accordance with the present invention input signals to a PLA are used to energize at least one of the functioning portions of the PLA. At least one of the inputs to the PLA is logically coupled to a selected output line in the AND array which is used as a power control line. The logical coupling is such that the output signal or power control line is indicative of whether a useful logic function is to be performed in the PLA. If a useful function is to be generated the selected line activates a switch controlling the powering of another portion of the PLA such as the OR array turning on the power to at least a portion of the OR array.

Therefore it is an object of the present invention to reduce power consumption in PLAs.

It is another object of the present invention to reduce power in PLAs using the input signals to control the supply of power to at least one of the arrays.

It is a further object of the present invention to reduce power in PLAs by using the logic capacity of the array to power sections of the PLA when and only when it is being used.

BRIEF DESCRIPTION OF THE DRAWINGS

These and other objects, features and advantages of the invention will be apparent from the following detailed description of a preferred embodiment of the invention as illustrated in the accompanying drawings of which:

FIG. 4 is a scheme in which both the OR array and latches are conditionally powered using the present invention.

DETAILED DESCRIPTION

Figure 1:
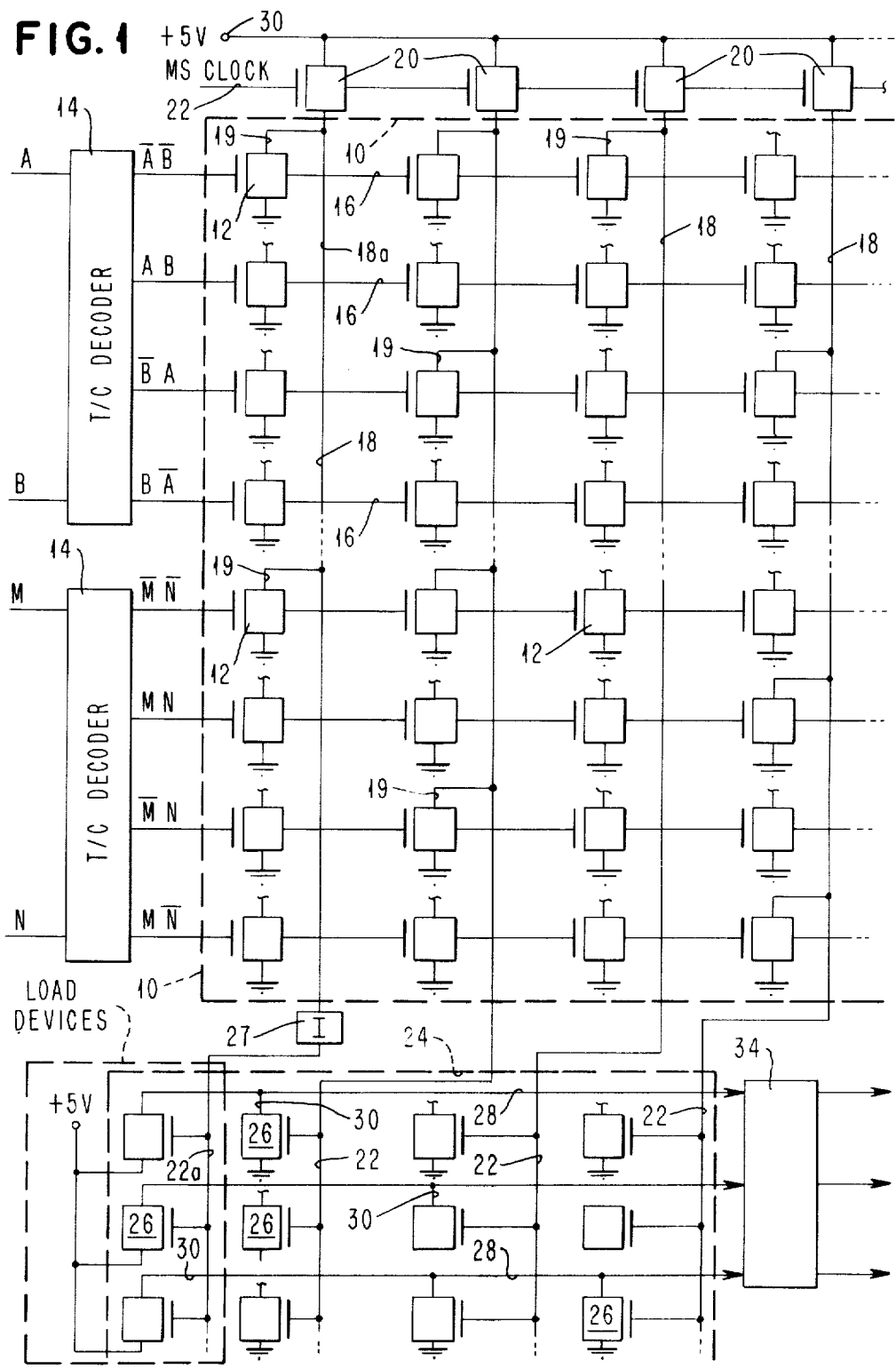
FIG. 1 is a schematic diagram of one embodiment of the invention in which the OR array is conditionally powered using the present invention.

Referring to FIG. 1, an array 10 of logical elements 12 is fed min-terms from a plurality of two-bit decoders 14 of which decoders 14 are representative. The decoders each supply a down level on one of the four input lines 16 of the AND array 10 coupled to a particular decoder for each of the four possible combinations of up and down levels of the two binary input variables supplied to that decoder. The combination of binary input signals producing a down level on any input line 16 is shown above the input line adjacent to the decoder generating the up and down levels. The input lines of the array 10 are connected to the gates of a row of logic performing elements. When any input line is biased at an up level the logic performing devices 12 with their gates connected thereto are biased conductive. When any input line 16 is biased at a down level the devices 12 with their gates connected thereto are biased non-conductive.

An output line 18 is arranged orthogonally with respect to the input lines of the AND array alongside each column of logic performing elements. The drains of the operative logic performing elements are coupled by connections 19 to the output lines 18. When these operative elements are biased conductive they provide a path to ground for any potential on the output line 18 they are connected to. All the output lines of the AND array are powered from a positive source through devices 20. Sometime prior to the time the AND array is to be used, a clock signal 22 comes up and turns on each of the devices 20 precharging the output lines 18 of the AND array 10 to a positive potential. Thereafter, the output lines are conditionally discharged by those operative devices 12 with gates connected to an up input line 16 to perform logical function on the min-terms supplied by decoders 14. The levels on output lines of the AND array therefore each reflect a logical function performed in the AND array and the decoders on the inputs supplied to the decoders.

The output lines of the AND array are connected to an input line 22 of the OR array 24 for transmitting these logical functions to the OR array. All of the input lines 22 except the first input line 22a of the OR array are directly connected to one of the output lines of the AND array. The first input line is connected through an inverter 26 to the first output line of the AND array.

The input lines 22 of the OR array are each connected to the gates of a column of logic performing elements 26 so that when any input line 22 is biased up by the AND array 24 the devices coupled thereto will be rendered conductive. When that input line is biased down the logic performing elements coupled thereto will be non-conductive. Each row of logic performing element is positioned adjacent an output line 28 of OR array 24. These output lines are connected by connections 30 to the drains of certain of the logic performing elements so that when the logic performing element is biased conductive it will connect the output line to ground to drain and source path of the device.

As has been previously pointed out and has been typical of past arrays a clock signal 22 is used to supply power to gate power to the output lines 18 of the AND array 10. This type of powering is referenced to herein as an unconditional precharge. That is the AND array is precharged prior to the time for performing the logic function in the array independent of the combination of logical inputs supplied to the array. Precharging in this manner saves power since it means that the AND array does not have to be continually supplied with excitation.

As opposed to unconditional precharging of an array, the present invention powers the OR array 24 to be conditionally precharged on the occurrence of some combination of logical inputs to the AND array. In the embodiment shown in FIG. 1 the condition used is that if any of the inputs to any of the decoders 14 is up the OR array will be charged. For this purpose, the term (such as $\overline{A} \ \overline{B}$ and $\overline{M} \ \overline{N}$) of each decoder that is output which is down only when neither of the inputs to the decoders is up is connected to the first product line 18A of the array 12) Inputs to any of the decoders 14 is up the first product term output line 18a will be held down.

The output of the first product term line 18 is fed through an inverter 27 to the first input line of the OR array. Therefore whenever the output line 18A of the AND array is down the input line of the OR array will be up. Each of the devices 26 in the first column of devices controls the supplying of excitation to an output line 28 of the OR array. The drains of each of the devices is connected to a 5-volt source while the sources of each of the devices is connected to one of the output lines 32. When any input to put to the decoder 14 comes up, the first input line to the OR array will come up biasing all of these devices in the row conductive permitting current from the 5-volt source to charge the output lines 24 of the arrays through devices 26a.

Now with the array OR array powered, the logical signals on the output lines 18 of the AND array can functionally manipulate the output lines 32 of the OR array by biasing certain lines down through devices 26.

The output of the OR array will each connect to a latch 34 and the outputs of the latches function as outputs to the PLA or are fed back to one of the inputs of the decoders 14 so that the PLA is capable of performing sequential and combinatorial logic.

Figure 2:
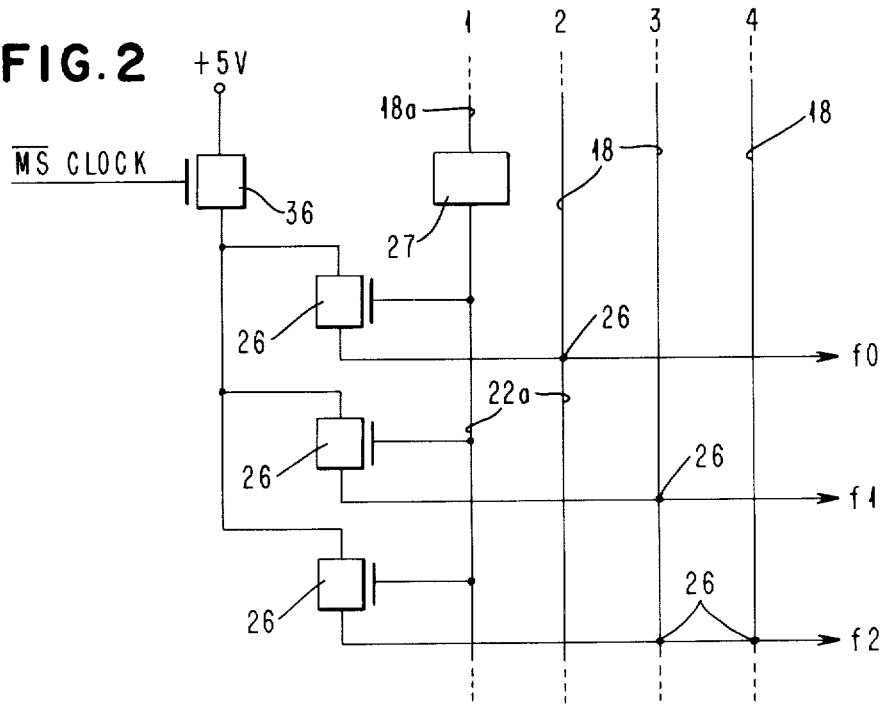
FIG. 2 shows a schematic diagram in which a dynamically powered OR array is conditionally powered using the present invention.

In FIG. 1 the OR array is powered directly from a 5-volt source. In FIG. 2 a different type of power source is used to remove array powered in the precharged state. Here an additional device 36 is transposed between the drains of the 5-volt source and the device 24a of the first column of OR array devices. The clock signal supplied to devices 36 removes power completely from the OR array while the output lines of the AND array are being precharged. The dots 26 represent logic performing elements which have their drains coupled to the output lines of the OR array. The removing non-functioning logic performing elements have been left out of this figure and the following figures for the sake of simplicity.

Figure 3:
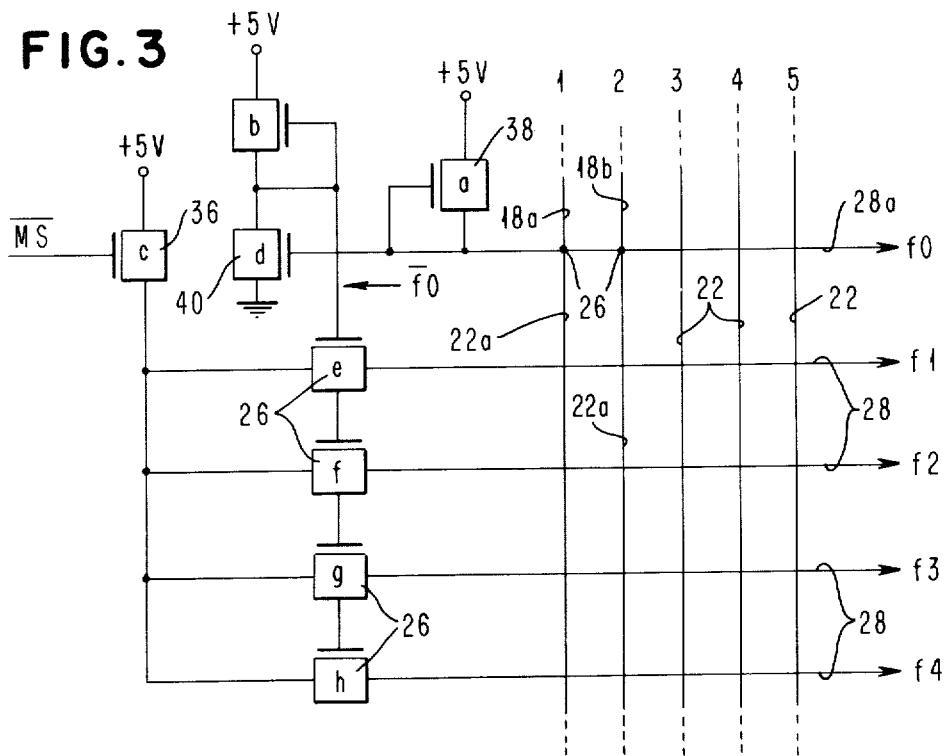
FIG. 3 is another scheme for powering the OR array.

In FIGS. 1 and 2 the logical decision to turn the OR array power on or off is made by the AND array. As shown in FIG. 3 the present invention can be implemented using both the AND and OR arrays to generate the logic for controlling the power.

The function f0 on the OR array output line 28a is the logical OR of product terms on output lines 18A 18B of the AND array. Output line 26a is always powered by depletion load device 38 maintaining line 28 at an up level as long as lines 18a and 18b remain down. When either line 18a or 18b is raised up the output lines shunted to ground providing low output on line 28a. In addition to being a useful logical output, the function f0 is fed to the gate of enhancement mode device 40 which inverts the line on line 28 and uses it to control load devices: e, f, g and h which are the power determining load devices for the rest of the OR array output lines 28. In addition device 36 is controlled by clock signal $\overline{ms}$ which is connected in series with the load devices e, f, g, h, etc. to unconditionally depower the OR array while the AND array is in the precharge state.

The three previous figures describe powering the OR array on the basis of a logical input to the PLA. The concept can further be expanded by powering the registers as shown in FIG. 4.

Having thus described our invention, what we claim as new, and desire to secure by Letters Patent is:

1. In a programmable logic array of the type which operates on binary data variables in an AND matrix of logic performing elements to generate product terms and supplies them to an OR matrix of logic performing elements which in turn feeds sums of these product terms into a storage means to provide those output signals in various combinations as inputs to the AND array, the improvement comprising:

logic means including at least logic performing elements in the AND matrix to generate a control signal from said binary data variables and powering means responsive to said control signal to conditionally power at least a portion of one of the logic performing parts of the programmable logic array in response to said control signal.

2. The programmable logic array of claim 1 wherein said at least one of the logic performing parts is the OR matrix.

3. The programmable logic array of claims 1 or 2 wherein said logic means includes logic performing elements in the OR matrix.

4. The programmable logic array of claims 1, or 2 wherein said powering means includes logic performing elements in the OR matrix.

5. The programmable logic array of claims 1 or 2 wherein said storage means is conditionally powered by said powering means.

6. In a programmable logic array for generating logic functions from binary data variables of the type which includes an AND matrix generating inputs to an OR matrix which in turn feeds its output signals into a storage means that provides output signals which can be used in various combinations as inputs to the AND matrix, the method of conditionally powering at least a portion of one of the logic performing matrices or storage means as a function of said binary data variables when and only when said binary data variables are supplied to the programmable logic array in a logically useful combination.

* * * * *